(12) United States Patent
Miyazaki et al.

(10) Patent No.: US 7,570,000 B2
(45) Date of Patent: Aug. 4, 2009

(54) CONTROL DRIVE CIRCUIT FOR ELECTRIC POWER TOOL

(75) Inventors: Hiroshi Miyazaki, Hikone (JP); Akira Kawai, Hikone (JP)

(73) Assignee: Matsushita Electric Works, Ltd., Osaka (JP)

( * ) Notice: Subject to any disclaimer, the term of this patent is extended or adjusted under 35 U.S.C. 154(b) by 202 days.

(21) Appl. No.: 11/711,046

(22) Filed: Feb. 27, 2007

(65) Prior Publication Data

US 2007/0200516 A1 Aug. 30, 2007

(30) Foreign Application Priority Data

Feb. 27, 2006 (JP) .............. 2006-051104

(51) Int. Cl.
*H02P 7/06* (2006.01)

(52) U.S. Cl. .............. 318/254; 318/434; 318/439; 318/801

(58) Field of Classification Search ......... 318/430–434, 318/376, 400.28
See application file for complete search history.

(56) References Cited

U.S. PATENT DOCUMENTS

| 4,988,931 A | | 1/1991 | Tsukahara et al. | |
|---|---|---|---|---|
| 5,537,015 A | | 7/1996 | Karwath | |
| 5,640,071 A | * | 6/1997 | Malaspina et al. | .......... 318/139 |
| 6,335,600 B1 | | 1/2002 | Kasai et al. | |
| 6,495,986 B2 | * | 12/2002 | Schwesig | .......... 318/801 |
| 6,573,681 B2 | * | 6/2003 | Schwesig | .......... 318/801 |
| 6,670,815 B2 | * | 12/2003 | Moddemann | .......... 324/527 |
| 6,737,822 B2 | * | 5/2004 | King | .......... 318/375 |
| 6,828,702 B2 | * | 12/2004 | Beyer et al. | .......... 310/68 C |
| 6,909,255 B2 | * | 6/2005 | Janicke et al. | .......... 318/400.28 |
| 6,987,371 B2 | * | 1/2006 | Kifuku | .......... 318/432 |
| 7,129,663 B2 | * | 10/2006 | Suzuki | .......... 318/504 |
| 7,294,985 B2 | * | 11/2007 | Kifuku | .......... 318/432 |
| 7,358,690 B2 | * | 4/2008 | Kifuku | .......... 318/62 |
| 2002/0063548 A1 | * | 5/2002 | Schwesig | .......... 318/801 |
| 2002/0084766 A1 | * | 7/2002 | Schwesig | .......... 318/801 |
| 2003/0164545 A1 | | 9/2003 | Nadd et al. | |
| 2004/0164694 A1 | * | 8/2004 | Janicke et al. | .......... 318/439 |
| 2004/0189229 A1 | | 9/2004 | Nadd et al. | |
| 2004/0257017 A1 | * | 12/2004 | Bay et al. | .......... 318/434 |
| 2005/0088126 A1 | * | 4/2005 | Kawashima et al. | .......... 318/434 |

FOREIGN PATENT DOCUMENTS

| EP | 0 643 473 | 3/1995 |
|---|---|---|
| EP | 1 083 654 | 3/2001 |
| WO | 03/077322 | 9/2003 |

* cited by examiner

*Primary Examiner*—Paul Ip
(74) *Attorney, Agent, or Firm*—Bacon & Thomas, PLLC

(57) ABSTRACT

In a control drive circuit for an electric power tool, a bridge-structured motor, which has a bridge structure and includes switching elements and a motor body, is connected to a power supply unit without any mechanical contacts, and an electric power is supplied to a control circuit for controlling the switching elements by turning on a trigger switch. Further, a circuit switch is provided at power supply sides of drive circuits for driving the switching elements, the circuit switch being controlled by the control circuit to interrupt supply of the electric power to the drive circuits.

12 Claims, 3 Drawing Sheets

CONTROL DRIVE CIRCUIT FOR ELECTRIC POWER TOOL

FIELD OF THE INVENTION

The present invention relates to a control drive circuit for an electric power tool.

BACKGROUND OF THE INVENTION

As for an electric power tool in which a motor is used as an electric power source and a secondary battery is used as a power supply unit, there are provided various types of control drive circuits for driving the motor. (see, Japanese Patent Laid-open Application No. 2005-137087 (hereinafter, referred to as "Patent Reference 1")).

In recently provided control drive circuits, mechanical contacts are removed from circuits between a power supply unit and a motor in order to improve vibration-resistance and durability, while an electric power is supplied to a control circuit in response to the 'ON' operation of a trigger switch and the supply of the power thereto is interrupted when a trigger switch is turned off in order to avoid the unnecessary consumption of a secondary battery.

An example of the above-described control drive circuit is shown in FIG. 3. In the drawing, reference symbol D denotes a battery pack in which a number of secondary battery cells is connected in series, reference symbol CPU denotes a control circuit configured with a single-chip microcomputer, and reference symbol SW1 denotes a trigger switch. Here, a brushless motor, in which coils are bridge-connected with each other, is used as a motor. Reference symbols U, V and W in FIG. 3 denote connection nodes to the coils of the motor. The electric power is supplied to the coils through upper switching elements F1, F3 and F5 of U, V and W-phases, respectively, and lower switching elements F2, F4 and F6 thereof, respectively. In the drawing, reference numeral 3 indicates a drive circuit for driving the upper switching elements, and reference numeral 4 indicates a drive circuit for driving the lower switching elements. In the drawing, reference symbols V•3, W•3, V•4 and W•4 denote connections between the control circuit CPU and drive circuits 3 and 4 of V and W-phase, respectively.

When the trigger switch SW1 is turned on, the electric power is supplied to the control circuit CPU. Next, according to the output signal of the control circuit CPU, when the switching element F1 is turned on by the operation of the drive circuit 3 for the U-phase upper switching element (the drive circuit 3 having, e.g., transistors Q6, Q7 and Q8), the switching element F4 is turned on by the operation of the drive circuit 4 for the V-phase lower switching element. Thereafter, when the switching element F3 is turned on by the operation of the drive circuit 3 for the V-phase upper switching element, the switching element F6 is turned on by the operation of the drive circuit 4 for the W-phase lower switching element. Furthermore, when switching element F5 is turned on by the operation of the drive circuit 3 for the W-phase upper switching element, the switching element F2 is turned on by the operation of the drive circuit 4 for the U-phase lower switching element, (the drive circuit 4 having e.g., transistors Q9, Q10 and Q11). In this manner, the three-phase motor is driven. Further, the electric power is supplied to each of the drive circuits 3 via a boost circuit 5. Moreover, diodes are connected in anti-parallel with the switching elements F 1 to F6 in order to brake the motor when stopping the motor by interrupting the supply of the electric power. To do so, transistors Q1 and Q2 for self-sustaining are provided such that the electric power is supplied to the control circuit CPU for a while after the trigger switch SW1 has been turned off.

In turning off the trigger switch SW1 to stop the operation of the motor, there arises no problem in case the supply of the electric power to the drive circuits 3 and 4 is interrupted prior to the control circuit CPU. However, in case the supply of the electric power to the control circuit CPU is interrupted first, the drive circuit 4 is turned on (the output of each of U-phase transistors Q11 and Q10 becomes high) when the output of the control circuit CPU is low, and thus an electric current flows through the switching element F2. At this time, the switching element F1, which is driven by the drive circuit 3 connected thereto via the boost circuit 5, is also turned on, so that a punch-through current flows through the bridge-structured switching element F1, therefore the switching elements are destroyed. The same problem occurs in the switching elements of other phases.

SUMMARY OF THE INVENTION

It is, therefore, an object of the present invention to provide a control drive circuit for an electric power tool, the control drive circuit capable of preventing the destruction of bridge-structured switching elements.

In accordance with a first aspect of the present invention, there is provided a control drive circuit for an electric power tool, wherein a motor, which has a bridge structure and includes switching elements and a motor body, is connected to a power supply unit without any mechanical contacts, and an electric power is supplied to a control circuit for controlling the switching elements by turning on a trigger switch, and wherein a circuit switch is provided at power supply sides of drive circuits for driving the switching elements, the circuit switch being controlled by the control circuit to interrupt supply of the electric power to the drive circuits.

In accordance with the first aspect of the present invention, unprepared 'ON' operations of the drive circuits are eliminated, so that it does not occur that the punch-through current flows through the switching elements by interrupting the supply of the electric power to the control circuit.

It is preferable that the circuit switch is turned on after the electric power has been supplied to the control circuit.

It is preferable that the circuit switch is turned on after the electric power has been supplied to the control circuit. In accordance with this embodiment, the punch-through current does not flow at the time of supplying the electric power.

It is preferable that the circuit switch is provided at either of an upper and a lower portion in the bridge structure, so that the rating of the circuit switch is lowered. It is also preferable the circuit switch is provided at both of the upper and the lower portion in the bridge structure, so that the punch-through current does not flow even if any of the switching elements on either the upper or the lower portions in the bridge structure is short-circuited.

It is preferable that the circuit switch is turned off after a lapse of time required for a braking operation in turning off the motor, thereby achieving the braking operation securely.

It is preferable that the circuit switch is connected in anti-parallel with a diode. In accordance with this embodiment, even if the switching element enters into a semi-turned-on state because voltages are developed between a drain and a source and between a gate and the drain in a switching element configured with an FET due to moisture, the voltages can be dropped, and thus the switching element does not destroyed.

In accordance with a second aspect of the present invention, there is provided a control drive circuit for an electric power tool, wherein a motor, which has a bridge structure and includes switching elements and a motor body, is connected to a power supply unit without any mechanical contacts, and an electric power is supplied to a control circuit for controlling the switching elements by turning on a trigger switch, and wherein forcible turn-off units for forcibly turning off the switching elements according to an output of the control circuit are provided.

In accordance with the second aspect of the present invention, the punch-through current does not flow through the switching elements.

In accordance with the aspects of the present invention, there is provided either the circuit switch provided at the power supply sides of the drive circuits for driving the switching elements or a forcible turn-off unit for forcibly turning off the switching elements, so that the punch-through current does not flow through the switching elements when the supply of the electric power is interrupted, and thus the switching elements are not destroyed by the punch-through current.

BRIEF DESCRIPTION OF THE DRAWINGS

The above and other objects and features of the present invention will become apparent from the following description of embodiments, given in conjunction with the accompanying drawings, in which.

DETAILED DESCRIPTION OF THE PREFERRED EMBODIMENTS

Figure 1:
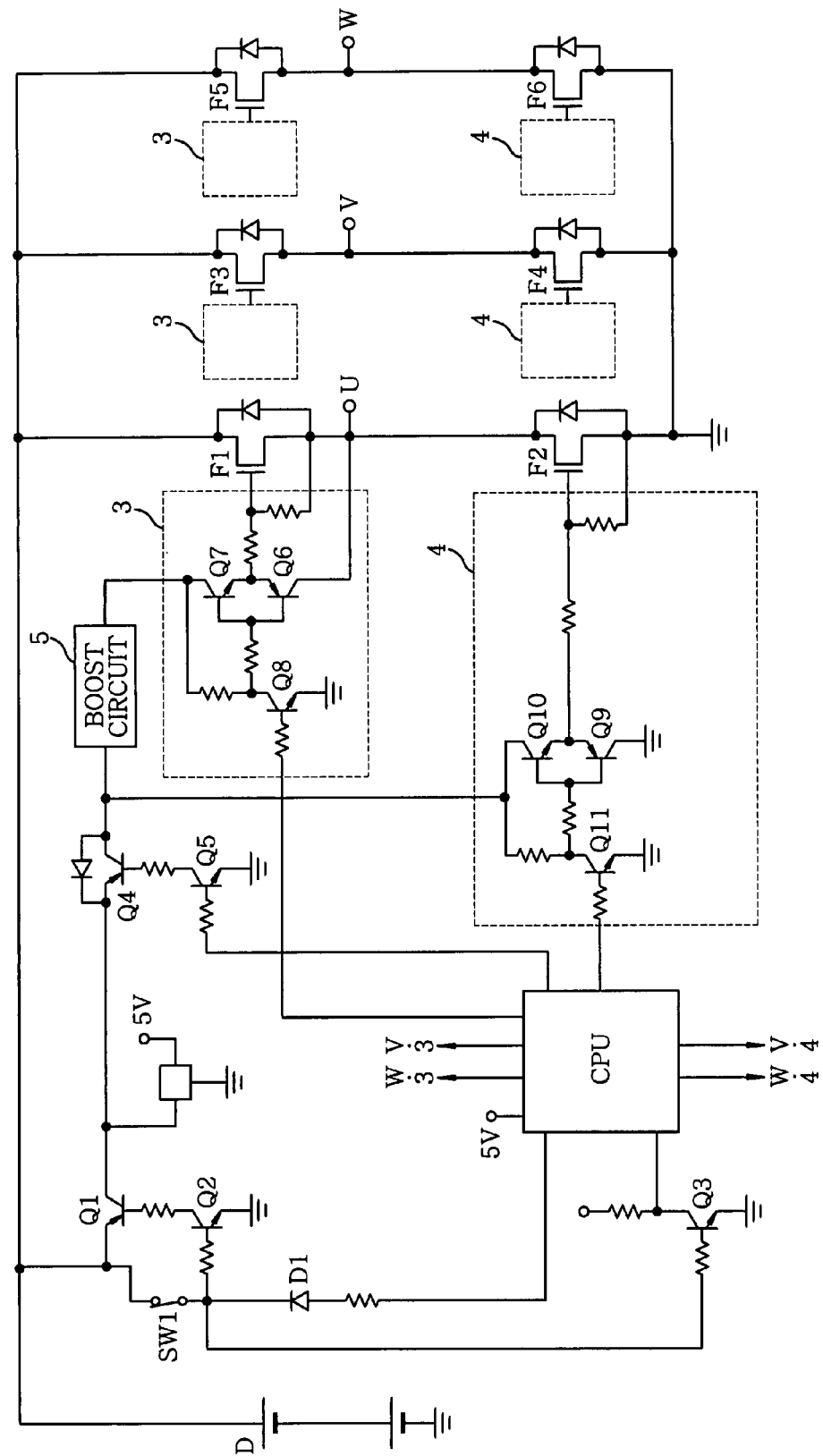
FIG. 1 is a circuit diagram showing a control drive circuit in accordance with an embodiment of the present invention.
Figure 3:
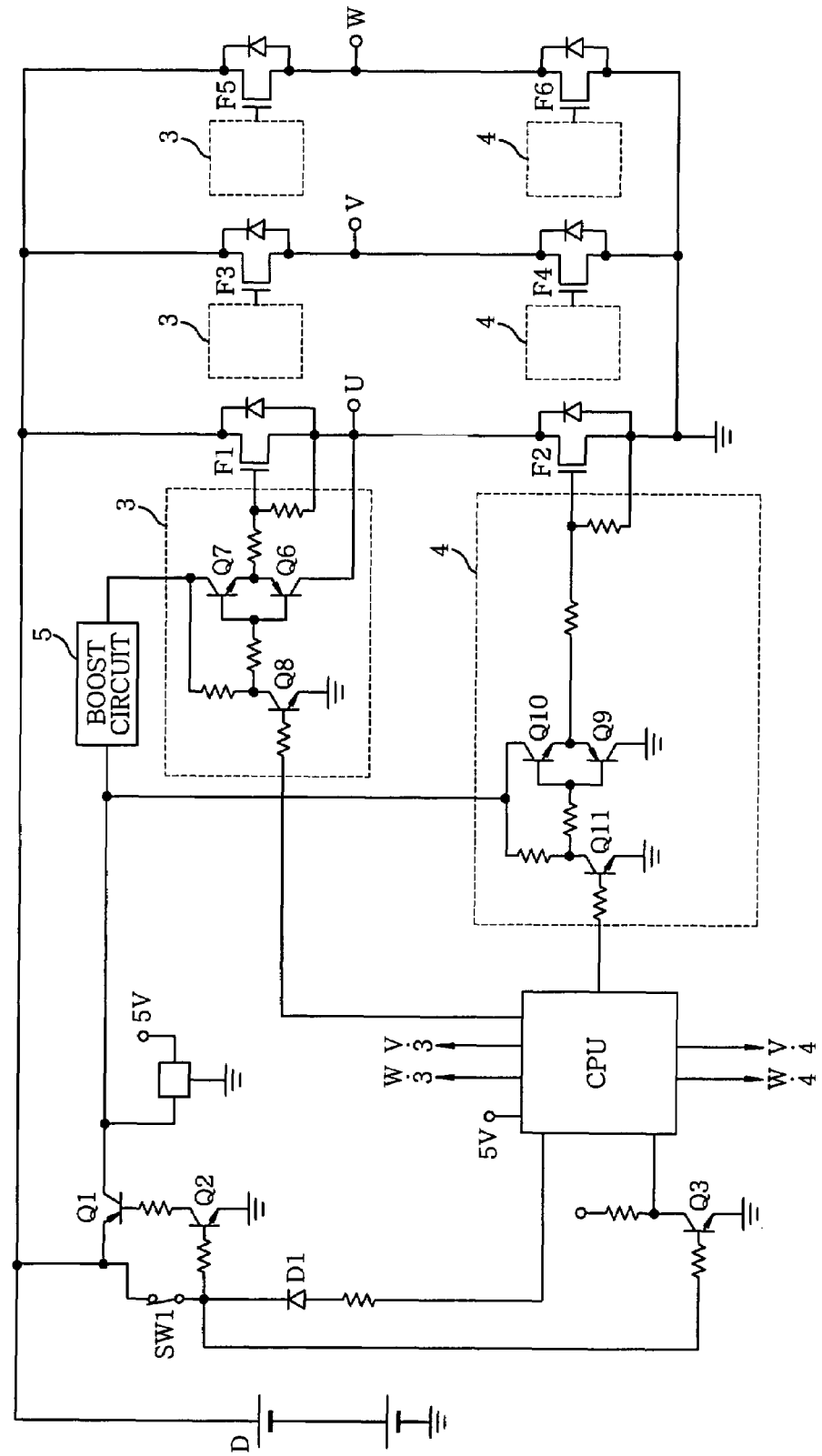
FIG. 3 depicts a circuit diagram showing a conventional control drive circuit.

Hereinafter, the present invention will be explained based on embodiments illustrated in the accompanying drawings. FIG. 1 is a circuit diagram showing a control drive circuit in accordance with an embodiment of the present invention. Since basic configuration thereof is the same as those of the conventional one shown in FIG. 3, a redundant description thereof will be omitted. A circuit switch (transistor) Q4 is disposed on power supply sides of the drive circuits 3 and 4 for driving the bridge-structured switching elements F1 to F6. The circuit switch Q4 is turned on and off via a transistor Q5 according to an output of the control circuit CPU. When the circuit switch Q4 is turned off, the supply of the electric power to the drive circuits 3 and 4 is interrupted.

Further, when an electric power is supplied to the control circuit CPU by turning on the trigger switch SW1, the circuit switch Q4 is turned on by the output of the control circuit CPU. Thereafter, the drive circuits 3 and 4 and the switching elements F1 to F6 are controlled to be driven, thereby driving a motor.

When the trigger switch SW1 is turned off, an electric power is supplied to the control circuit CPU via the transistor Q2 for self-sustaining for a predetermined period of time. At this time, the control circuit CPU turns on the lower switching elements F2, F4 and F6 via the drive circuit 4 only for a short period of time (about 50 ms~200 ms), thereby performing a braking operation. Thereafter, about 1 ms~100 ms later, the control circuit CPU turns off the circuit switch Q4 to interrupt the supply of the electric power to the drive circuits 3 and 4, thus preventing a punch-through current from flowing through the switching elements. Further, the interruption of the supply of the electric power to the control circuit CPU is performed after the 'OFF' operation of the circuit switch Q4 (for example, about 1 ms~100 ms later).

A diode connected in anti-parallel with the circuit switch Q4, is provided to prevent the switching elements F1 to F6 from being destroyed in the following case. Since the electric power tool may be used when it is raining, for example, voltages may be developed between a drain and a source and between a gate and the drain in a switching element configured with an FET due to moisture, so that the switching element may enter into a semi-turned-on state. If such voltages are not dropped, the switching element would be destroyed. However, in case the diode is provided, the voltages can be dropped through the diode.

In the embodiment shown in FIG. 1, the circuit switch Q4 is disposed on the power supply sides of the upper drive circuit 3 on the upper portion in the bridge structure and the lower drive circuit 4 on the lower portion therein, thus preventing a punch-through current from flowing even if any of the switching elements F1 to F6 on either the upper or the lower portion in the bridge structure is short-circuited. Moreover, it is preferable that the circuit switch Q4 is disposed on the power supply side of either of the drive circuits 3 and 4. In this case, the rating may be reduced by half.

Figure 2:
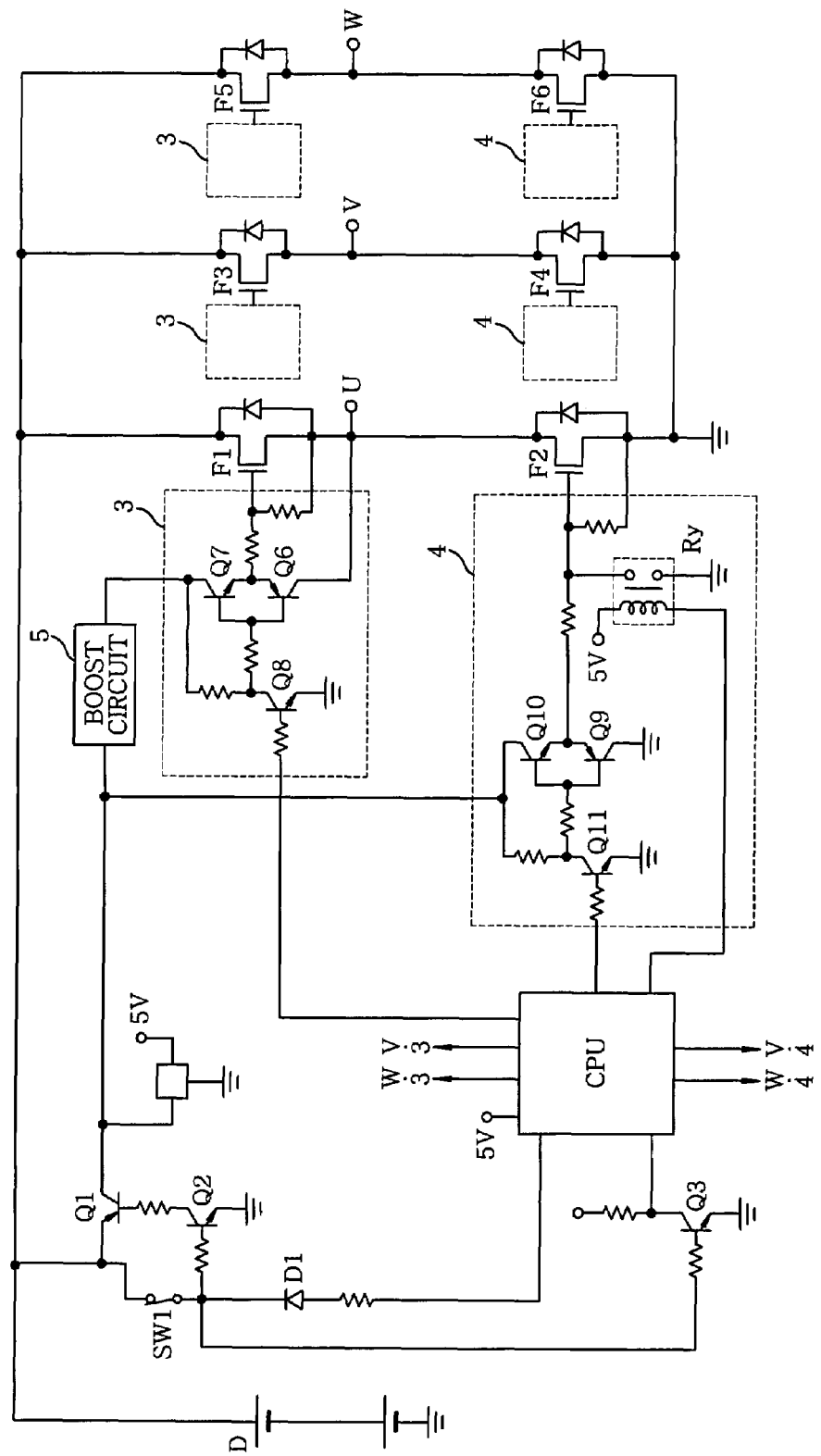
FIG. 2 illustrates a circuit diagram showing a control drive circuit in accordance with another embodiment of the present invention.

FIG. 2 illustrates a circuit diagram showing a control drive circuit in accordance with another embodiment of the present invention. In this embodiment, a normally closed relay Ry, which is turned off by an output of the control circuit CPU, is connected to the gate side of the switching elements to forcibly turn off the switching element when the supply of the electric power to the control circuit CPU is interrupted. According to this, the switching elements are not turned on after the supply of the electric power to the control circuit CPU has been interrupted, so that a punch-through current does not flow therethrough. Further, the relay is individually provided on the gate sides of the switching elements of the U, V and W-phases.

Although, a brushless motor has been used as a bridge-structured motor in the embodiment shown in FIG. 2, it is also preferable that a DC (Direct Current) motor is employed.

While the invention has been shown and described with respect to the embodiments, it will be understood by those skilled in the art that various changes and modification may be made without departing from the scope of the invention as defined in the following claims.

What is claimed is:

1. A control drive circuit for an electric power tool comprising:
   a power supply unit;
   a motor which has a bridge structure, the motor including switching elements through which an electric power is supplied to coils of the motor and being connected to the power supply unit without any mechanical contacts;
   drive circuits for driving the switching elements; a control circuit for controlling the drive circuits, the electric power being supplied to the control circuit by turning on a trigger switch; and
   a circuit switch, provided at power supply sides of the drive circuits and controlled by the control circuit to interrupt supply of the electric power to the drive circuits,
   wherein, when the trigger switch is turned off, the supply of the electric power to the control circuit is interrupted after the circuit switch has been turned off.

2. The control drive circuit of claim 1, wherein the circuit switch is turned on after the electric power has been supplied to the control circuit.

3. The control device circuit of claim 2, wherein, when the control circuit is turned on by turning on the trigger switch, the circuit switch is turned on by the output of the control circuit, and, after the circuit switch is turn on by the control circuit, the drive circuits and the switching elements are controlled to be driven.

4. The control drive circuit of claim 1, wherein the circuit switch is provided at either or both of an upper and a lower portion in the bridge structure.

5. The control drive circuit of claim 1, wherein the circuit switch is turned off after a lapse of time required for a braking operation in turning off the motor.

6. The control drive circuit of claim 1, wherein the circuit switch is connected in anti-parallel with a diode.

7. The control device circuit of claim 1, wherein, when the trigger switch is turned off, the control circuit turns off the circuit switch to interrupt the supply of the electric power to the drive circuit, and, after the circuit switch is turned off by the control circuit, the control circuit is turned off, thus preventing a punch-through current from flowing the switching elements.

8. A control drive circuit for an electric power tool comprising:
 a power supply unit;
 a motor which has a bridge structure, the motor including switching elements through which an electric power is supplied to coils of the motor and being connected to the power supply unit without any mechanical contacts;
 drive circuits for driving the switching elements; a control circuit for controlling the drive circuits the electric power being supplied to the control circuit by turning on a trigger switch; and
 forcible turn-off units for forcibly turning off the switching elements according to an output of the control circuit so that the switching elements are not allowed to be in a turn-on state after the supply of the electric power to the control circuit has been interrupted.

9. The control device circuit of claim 8, wherein the forcible turn-off units are connected to control electrodes of the switching elements.

10. The control device circuit of claim 9, wherein the forcible turn-off units turn off the switching elements by grounding the control electrodes.

11. The control device circuit of claim 10, wherein the forcible turn-off units are normally closed relays.

12. The control device circuit of claim 8, wherein the forcible turn-off units are normally closed relays.

* * * * *